(12) United States Patent
Lee et al.

(10) Patent No.: US 7,705,433 B2
(45) Date of Patent: Apr. 27, 2010

(54) SEMICONDUCTOR PACKAGE PREVENTING GENERATION OF STATIC ELECTRICITY THEREIN

(75) Inventors: Hee-seok Lee, Yongin-si (KR); Yun-seok Choi, Hwaseong-si (KR); Eun-seok Song, Seoul (KR)

(73) Assignee: Samsung Electronics, Co., Ltd., Suwon-Si (KR)

( * ) Notice: Subject to any disclaimer, the term of this patent is extended or adjusted under 35 U.S.C. 154(b) by 154 days.

(21) Appl. No.: 11/870,533

(22) Filed: Oct. 11, 2007

(65) Prior Publication Data

US 2008/0087988 A1 Apr. 17, 2008

(30) Foreign Application Priority Data

Oct. 11, 2006 (KR) .................. 10-2006-0098865

(51) Int. Cl.
*H01L 23/552* (2006.01)

(52) U.S. Cl. ............... 257/659; 257/E23.114; 257/692; 257/693

(58) Field of Classification Search ........... 257/659, 257/678, 713, 777, 686, 690, 692, 693, 697, 257/730, E23.114, E23.024

See application file for complete search history.

(56) References Cited

U.S. PATENT DOCUMENTS

| 6,011,299 | A | * | 1/2000 | Brench | 257/660 |
| 6,538,333 | B2 | * | 3/2003 | Kong | 257/777 |
| 7,355,289 | B2 | * | 4/2008 | Hess et al. | 257/787 |
| 2008/0073756 | A1 | * | 3/2008 | Heitzer et al. | 257/659 |

FOREIGN PATENT DOCUMENTS

| JP | 08-097311 | 4/1996 |
| JP | 09-129391 | 5/1997 |
| KR | 1997-0063691 | 9/2007 |

* cited by examiner

*Primary Examiner*—Victor A Mandala
*Assistant Examiner*—Scott Stowe
(74) *Attorney, Agent, or Firm*—F. Chau & Associates, LLC

(57) ABSTRACT

A semiconductor package includes a chip including a conductive pattern thereon, a conductive network attached on a surface of the chip to absorb static electricity, at least one conductive rod attached to the conductive network, wherein the at least one conductive rod is formed substantially perpendicularly to the conductive network, and a grounding portion discharging the static electricity absorbed from the conductive network.

16 Claims, 4 Drawing Sheets

SEMICONDUCTOR PACKAGE PREVENTING GENERATION OF STATIC ELECTRICITY THEREIN

CROSS-REFERENCE TO RELATED PATENT APPLICATION

This application claims the benefit of Korean Patent Application No. 10-2006-0098865, filed on Oct. 11, 2006, in the Korean Intellectual Property Office, the disclosure of which is incorporated by reference herein in its entirety.

BACKGROUND OF THE INVENTION

1. Technical Field

The present disclosure relates to a semiconductor package, and more particularly, to a semiconductor package substantially preventing generation of static electricity using a conductive rod.

2. Discussion of Related Art

To substantially prevent generation of static electricity in a semiconductor device, a cell for preventing the generation of the static electricity is inserted into an input/output pad unit of the semiconductor device. As semiconductor devices become smaller, a different cell structure has been used for substantially preventing the generation of the static electricity. However, potential reductions in the generation of the static electricity by changing the structure of the cell are limited.

Therefore, a need exists for a method of substantially preventing static electricity for a semiconductor device having a small size.

SUMMARY OF THE INVENTION

According to an exemplary embodiment of the present invention, a semiconductor package comprises a chip including a conductive pattern thereon, a conductive network attached on a surface of the chip to absorb static electricity, at least one conductive rod attached to the conductive network, wherein the at least one conductive rod is formed substantially perpendicularly to the conductive network, and a grounding portion discharging the static electricity absorbed from the conductive network.

The chip can be a single chip having a single layer. The chip can be a multi-layered chip including a plurality of layers of single chips. The chip can be a printed circuit board.

The conductive network may include a conductive plane covering the surface of the chip. The conductive network may include conductive lines covering the surface of the chip.

An effective area of the conductive network for absorbing the static electricity may increase when a height of the conductive rod increases. A radius of the effective area can be substantially the same as the height of the conductive rod.

The at least one conductive rod can have a predetermined height so that the surface of the chip can absorb the static electricity. The conductive rod can be attached to the surface of the chip to have a predetermined height, such that the surface of the chip can absorb the static electricity. The conductive rod can be formed adjacent the grounding portion. The conductive rod can be formed using one of a wire bonding method, an electric plating method, and a micro electro mechanical system.

The conductive network and the grounding portion can be electrically connected to each other using conductive wires.

The surface of the chip may include an input pad, an output pad, and a grounding pad, which are insulated from the conductive network and are connected to the conductive pattern in the chip.

The conductive network can be electrically connected to the grounding pad.

According to an exemplary embodiment of the present invention, a semiconductor package comprises a conductive network formed on a chip, at least one first conductive rod formed on the conductive network, a printed circuit board receiving the chip, at least one second conductive rod formed on the printed circuit board, and a grounding portion electrically connected to the conductive network formed on the printed circuit board, wherein the grounding portion discharges static electricity received from the conductive network.

BRIEF DESCRIPTION OF THE DRAWINGS

Exemplary embodiments of the present invention can be understood in more detail from the following descriptions taken in conjunction with the accompanying drawings in which.

DETAILED DESCRIPTION OF EXEMPLARY EMBODIMENTS

The invention is described more fully hereinafter with reference to the accompanying drawings, in which exemplary embodiments of the invention are shown. This invention may, however, be embodied in many different forms and should not be construed as limited to the embodiments set forth herein. An exemplary embodiment of the present invention substantially prevents the generation of the static electricity in a semiconductor chip using a conductive rod such as, for example, a light rod. A conductive pattern is formed on the semiconductor chip. In an exemplary embodiment of the present invention, different numbers of conductive rods can be positioned in different parts of the semiconductor chip or device.

Figure 1:
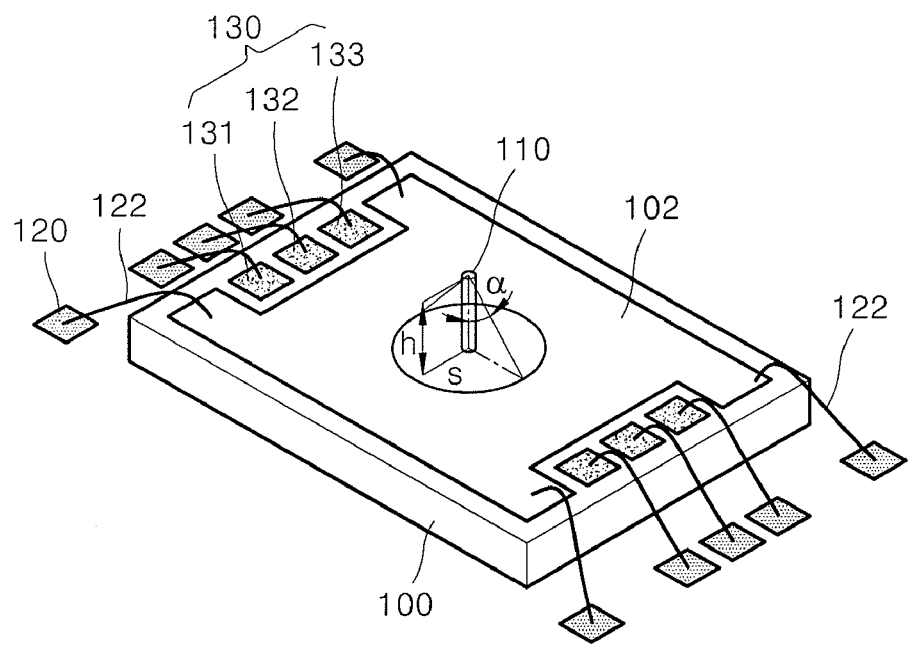
FIG. 1 is a perspective view of a semiconductor package according to an exemplary embodiment of the present invention.

FIG. 1 is a perspective view of a package for substantially preventing the generation of the static electricity according to an exemplary embodiment of the present invention. The package includes a first conductive rod 110 attached to a single chip 100. The single chip 100 includes a conductive pattern formed thereon.

Referring to FIG. 1, the package includes the single chip 100, a conductive network 102, the first conductive rod 110, and a grounding portion 120. The conductive pattern (not shown) is formed on the single chip 100. The conductive network 102 is attached on a surface of the single chip 100.

The conductive network 102 can be a path through which the static electricity flows. The conductive network 102 may be arranged so that a shortest distance is formed between the conductive network 102 and the grounding portion 120. In an exemplary embodiment, the conductive network 102 may be formed on one side of the single chip 100. In an exemplary embodiment, the conductive network 102 can cover up to an entirety of a surface of the single chip 100. For example, as shown in FIG. 1, the conductive network 102 can cover the entire surface of the single chip 100 except for an input/output pad unit 130 and peripheral regions of the single chip 100. In an exemplary embodiment, the conductive network 102 can be a conductive plane, or can be a conductive line such as a redistribution wire.

In an exemplary embodiment, the first conductive rod 110 can be attached substantially perpendicularly to the conductive network 102. The first conductive rod 110 may have a constant diameter at upper and lower portions thereof. A horizontal cross-section of the first conductive rod 110 can be at least partially curved, or can be angular. The diameter of the first conductive rod 110 can be determined according to a shape of the semiconductor package. The first conductive rod 110 can be formed of a material having high electric conductivity. The first conductive rod 110 may comprise, for example, one of gold (Au), silver (Ag), and aluminum (Al), but the material is not limited thereto.

The first conductive rod 110 can be attached to the conductive network 102 using various methods. For example, the first conductive rod 110 can be attached to the conductive network 102 using a wire bonding method or an electric plating method. In an exemplary embodiment, a micro electro mechanical system (MEMS) can be used. The first conductive rod 110 can be fabricated based upon, for example, a size of the semiconductor package or an environment of fabricating the first conductive rod 110.

A wire bonding method, an electric plating method, an MEMS method, etc. may be used to attach the conductive rod 110. When the first conductive rod 110 is attached using the wire bonding method, a wire is attached to the conductive network 102. The wire is grown in a direction substantially perpendicular to the conductive network 102. The wire is grown in the perpendicular direction to a predetermined length to form the first conductive rod 110.

The first conductive rod 110 absorbs induced static electricity. When the height h of the first conductive rod 110 is increased, an effective area S of the conductive network 102, to which the static electricity is transferred, also increases. A maximum angle ($\alpha$) between the boundary of the effective area S and the first conductive rod 110 is about 45°. A radius of the effective area S is substantially similar or equal to the height h of the first conductive rod 110. Therefore, the effective area S can be changed according to the height h of the first conductive rod 110.

The grounding portion 120 discharges the static electricity electrically transferred from the conductive network 102. The grounding portion 120 and the conductive network 102 can be connected to each other using a conductive wire 122. The single chip 100 can include the input/output pad unit 130 including an input pad 131, an output pad 133, and a grounding pad 132. In an exemplary embodiment, the conductive network 102 can be connected to the grounding pad 132 of the input/output pad unit 130.

In an exemplary embodiment, the shape and the arrangement of the conductive network 102, the grounding portion 120, and the input/output pad unit 130 can be different depending on, for example, the shape and usage of the semiconductor package.

Figure 2A:
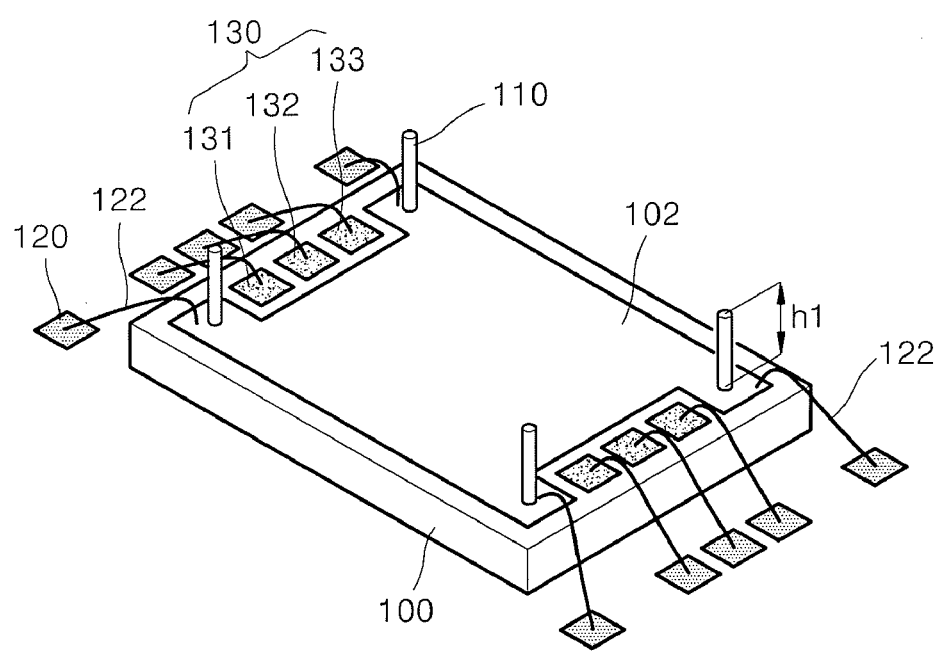
FIGS. 2A through 2C are perspective views of semiconductor packages according to exemplary embodiments of the present invention.
Figure 2B:
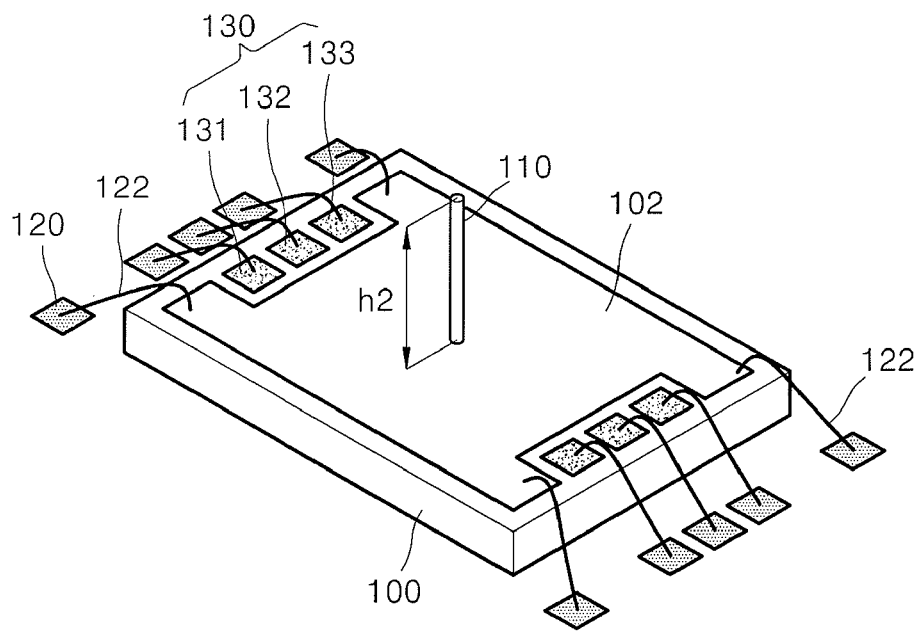
Figure 2C:
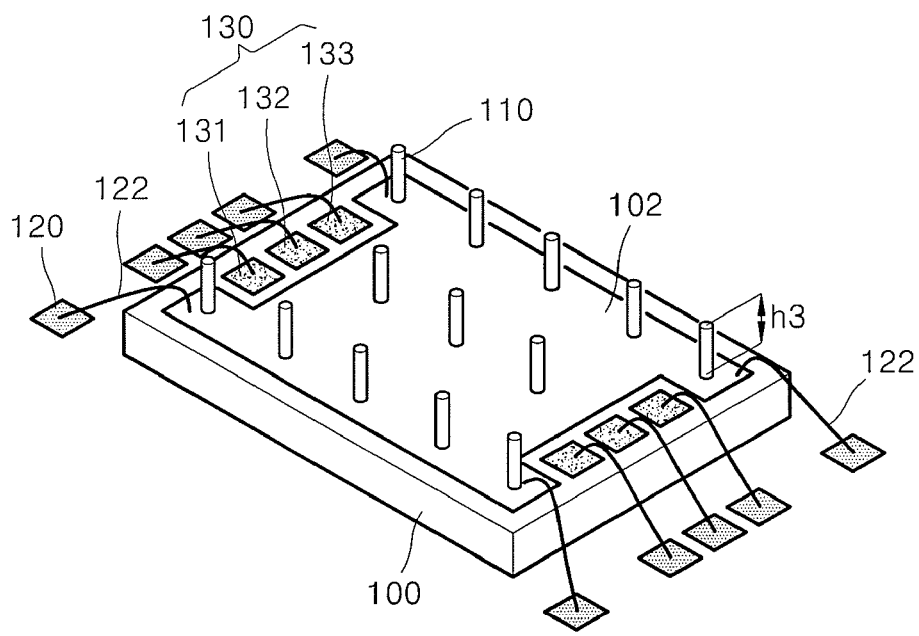

FIGS. 2A through 2C are perspective views showing packages according to exemplary embodiments of the present invention. In an exemplary embodiment, the first conductive rod 110 can be formed to have various shapes and arrangements.

Referring to FIG. 2A, a number of the first conductive rods 110 each having a first height h1 are attached to portions of the conductive network 102 which are adjacent to a number of the grounding portions 120. When the first conductive rods 110 are arranged to be adjacent to the grounding portions 120, the static electricity can be discharged through the grounding portion 120.

In FIGS. 2B and 2C, the first conductive rod 110 can have a second height h2 or a third height h3, respectively. The second height h2 is greater than the first height h1. Thus, the effective area S of the second height h2 is also larger than that of the first height h1. Therefore, a center portion of the conductive network 102 can absorb more static electricity using the first conductive rod 110 having the larger second height h2. In this exemplary embodiment, the effective area S can be distributed over the entire surface of the conductive network 102 using a small number of first conductive rods 110.

Referring to FIG. 2C, the first conductive rods 110 having a predetermined height h3 are arranged at predetermined intervals to ensure a total effective area. The third height h3 is smaller than the first height h1. Thus, the effective area S of each conductive rod 110 is reduced. That is, each of the first conductive rods 110 has an independent effective area S. Thus, the total effective area S can be formed over the entire surface of the conductive network 102.

Figure 3A:
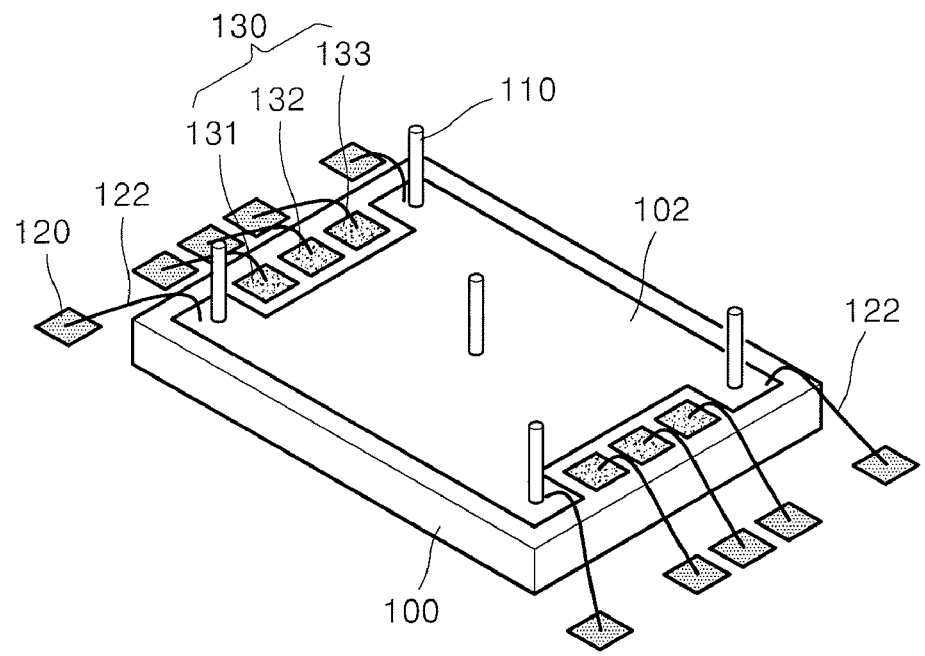
FIG. 3A is a perspective view of a semiconductor package including a single chip according to an exemplary embodiment of the present invention.
Figure 3B:
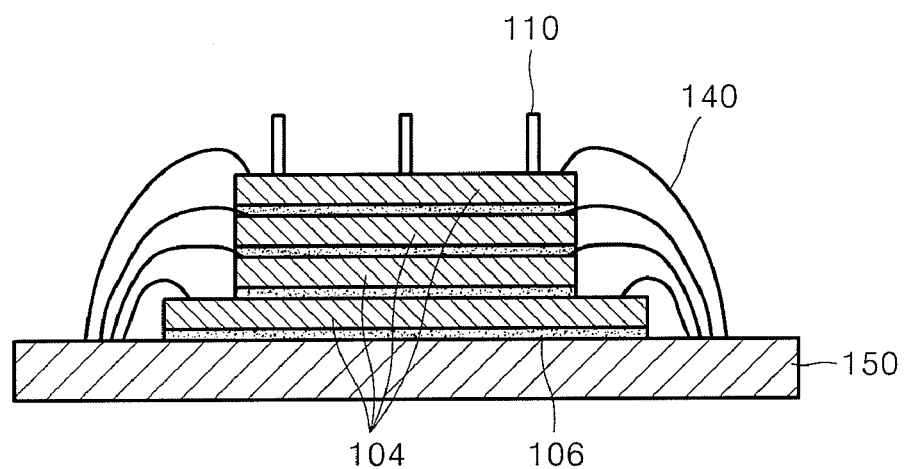
FIG. 3B is a cross-sectional view of a semiconductor package including a multi-layered chip according to an exemplary embodiment of the present invention.

FIG. 3A is a perspective view of a semiconductor package including a single chip according to an exemplary embodiment of the present invention. FIG. 3B is a cross-sectional view of a semiconductor package including a multi-layered chip according to an exemplary embodiment of the present invention.

FIG. 3A shows the single chip 100 including the first conductive rods 110 formed thereon. FIG. 3B shows a multi-layered chip 104 including the first conductive rods 110 formed thereon.

The multi-layered chip 104 can be formed by stacking a plurality of single chips using adhesive layers 106 on a circuit board 150 including a conductive pattern. The circuit board 150 can be, for example, a printed circuit board. In an exemplary embodiment, the first conductive rods 110 can be arranged and attached on the uppermost chip of the multi-layered chip 104 in the same way as shown in FIG. 3A. A reference numeral 140 denotes a conductive wire connecting the multi-layered chip 104 to the circuit board 150.

Figure 4:
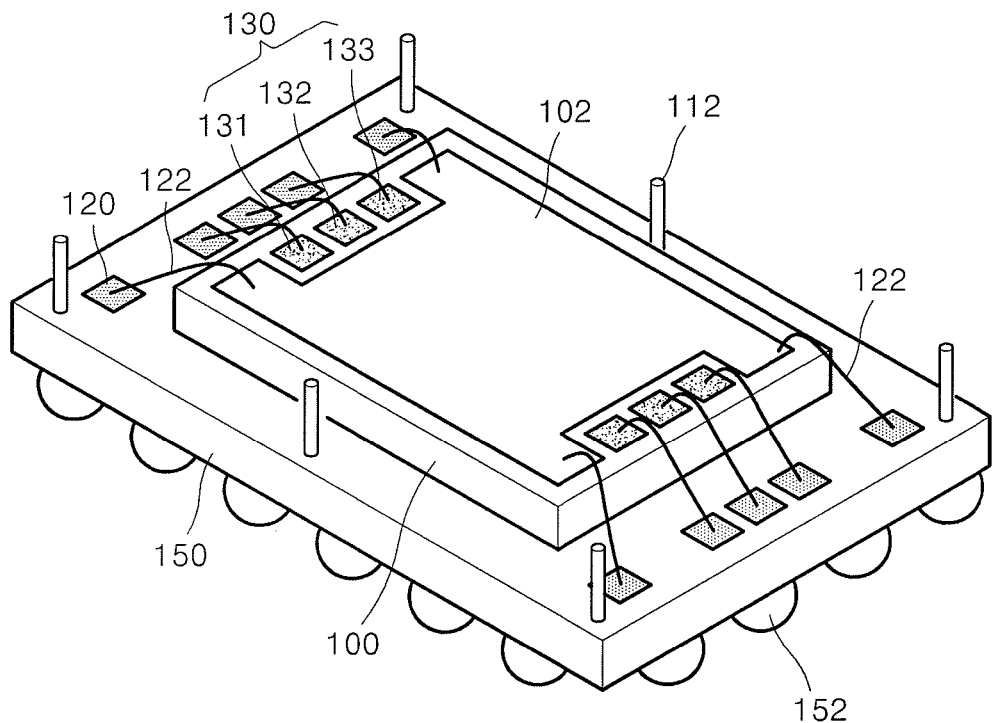
FIG. 4 is a perspective view of a semiconductor package according to an exemplary embodiment of the present invention.

FIG. 4 is a perspective view of a semiconductor package including a printed circuit board according to an exemplary embodiment of the present invention.

Figure 5:
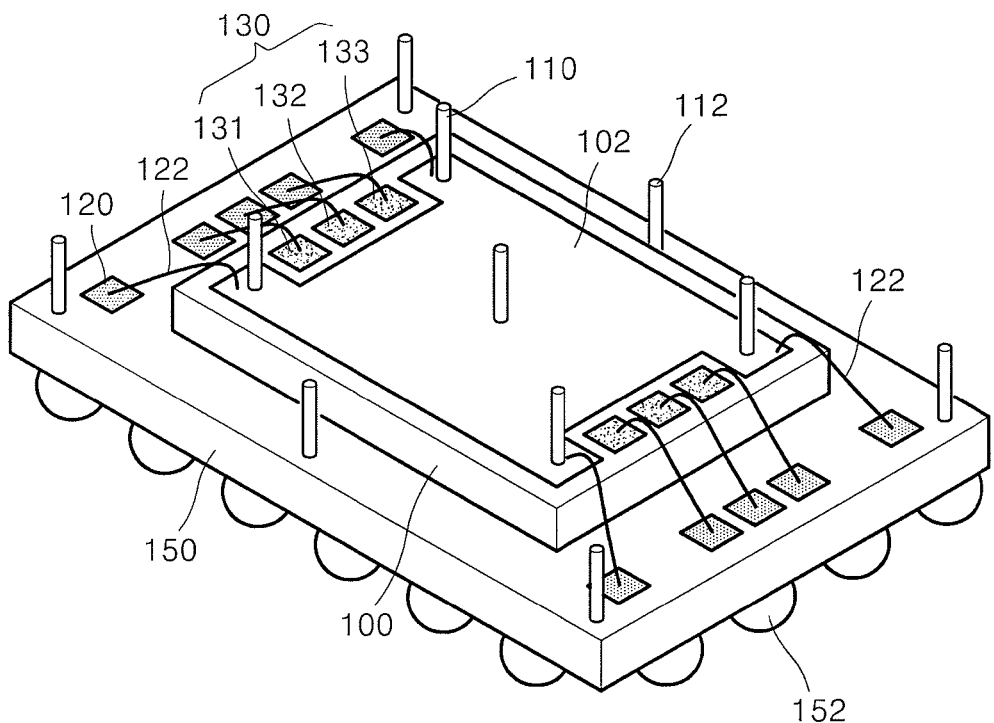
FIG. 5 is a perspective view of a semiconductor package according to an exemplary embodiment of the present invention.

Referring to FIG. 4, circuit patterns (not shown) are formed on the printed circuit board 150, and second conductive rods 112 are electrically attached to the circuit patterns. The single chip 100 is attached on a surface of the printed circuit board 150. Solder balls 152 are attached onto the other surface of the printed circuit board 150. The shape and fabrication method of the second conductive rods 112 can be the same as those of the first conductive rod 110. In an exemplary embodiment, positions, to which the second conductive rods 112 are attached, can differ based upon the shape of the circuit patterns (not shown) on the printed circuit board 150. The second conductive rods 112 may be formed adjacent the solder balls 152 that are externally grounded. FIG. 5 is a perspective view of a semiconductor package, in which first conductive rods 110 and second conductive rods 112 are respectively attached to the single chip 100 and the printed circuit board 150, according to an exemplary embodiment of the present invention. The shapes and arrangements of the first and second conductive rods 110 and 112 can be the same as those of the previous embodiments. However, according to exemplary embodiments of the present invention, the conductive rods can have various arrangements and shapes to be applied to the semiconductor packages.

Although exemplary embodiments of the present invention have been described herein with reference to the accompanying drawings, it is to be understood that the present invention should not be limited thereto and that various other changes and modifications may be affected therein by one of ordinary skill in the related art without departing from the scope or spirit of the invention. All such changes and modifications are intended to be included within the scope of the invention.

What is claimed is:

1. A semiconductor package comprising:
a chip including a conductive pattern thereon;
a conductive network attached on a surface of the chip to absorb static electricity;
at least one conductive rod attached to the conductive network, wherein the at least one conductive rod is formed substantially perpendicularly to the conductive network, the at least one conductive rod is electrically exposed to outside of the semiconductor package, a conductive rod of the at least one conductive rod is attached to the center of the conductive network; and
a grounding portion discharging the static electricity absorbed from the conductive network,
wherein the grounding portion and the conductive network are directly connected to each other using a conductive wire.

2. The semiconductor package of claim 1, wherein the chip is a single chip having a single layer.

3. The semiconductor package of claim 1, wherein the chip is a multi-layered chip including a plurality of layers of single chips.

4. The semiconductor package of claim 1, wherein the chip is a printed circuit board.

5. The semiconductor package of claim 1, wherein the conductive network includes a conductive plane covering the surface of the chip.

6. The semiconductor package of claim 1, wherein the conductive network includes conductive lines covering the surface of the chip.

7. The semiconductor package of claim 1, wherein an effective area of the conductive network for absorbing the static electricity increases when a height of the conductive rod increases.

8. The semiconductor package of claim 7, wherein a radius of the effective area is substantially the same as the height of the conductive rod.

9. The semiconductor package of claim 1, wherein the at least one conductive rod has a predetermined height so that the surface of the chip can absorb the static electricity.

10. The semiconductor package of claim 1, wherein the conductive rod is attached to the surface of the chip to have a predetermined height, such that the surface of the chip can absorb the static electricity.

11. The semiconductor package of claim 1, wherein the conductive rod is formed adjacent the grounding portion.

12. The semiconductor package of claim 1, wherein the conductive rod is formed using one of a wire bonding method, an electric plating method, and a micro electro mechanical system.

13. The semiconductor package of claim 1, wherein the conductive network and the grounding portion are electrically connected to each other using at least one conductive wire.

14. The semiconductor package of claim 1, wherein the surface of the chip includes an input pad, an output pad, and a grounding pad, which are insulated from the conductive network and are connected to the conductive pattern in the chip.

15. The semiconductor package of claim 14, wherein the conductive network is electrically connected to the grounding pad.

16. A semiconductor package comprising:
a conductive network formed on a chip;
at least one first conductive rod formed on the conductive network;
a printed circuit board receiving the chip;
at least one second conductive rod directly contacted on the printed circuit board; and
a grounding portion electrically connected to the conductive network formed on the printed circuit board,
wherein the grounding portion discharges static electricity received from the conductive network,
wherein a conductive rod of the at least one first conductive rod is attached to the center of the conductive network,
wherein the at least one first conductive rod and at least one second conductive rod are electrically exposed to outside of the semiconductor package.

* * * * *